United States Patent
Ershov

[11] Patent Number: 6,137,821
[45] Date of Patent: Oct. 24, 2000

[54] DURABLE ETALON BASED OUTPUT COUPLER

[75] Inventor: Alexander I. Ershov, San Diego, Calif.

[73] Assignee: Cymer, Inc., San Diego, Calif.

[21] Appl. No.: 09/217,340

[22] Filed: Dec. 21, 1998

Related U.S. Application Data

[63] Continuation-in-part of application No. 08/869,239, Jun. 4, 1997, Pat. No. 5,856,991, and application No. 08/886,715, Jul. 1, 1997, and application No. 08/926,721, Sep. 10, 1997, Pat. No. 5,852,627, and application No. 08/987,127, Dec. 8, 1997, abandoned, and application No. 08/204,111, Dec. 2, 1998.

[51] Int. Cl.[7] ........................................................ H01S 3/08
[52] U.S. Cl. .............................. 372/108; 372/19; 372/57; 372/98; 372/100; 372/5; 372/102; 372/20
[58] Field of Search ................................. 372/57, 98, 19, 372/108, 100, 5, 102, 20, 55

[56] References Cited

U.S. PATENT DOCUMENTS 5,898,725  4/1999  Fomenkov et al. ............. 372/102
5,901,163  5/1999  Ershov ............................. 372/20

Primary Examiner—Leon Scott, Jr.
Attorney, Agent, or Firm—John R. Ross

[57] ABSTRACT

A durable etalon based laser output coupler. The output coupler is especially useful for ultraviolet lasers such as an ArF excimer laser or an $F_2$ laser. The principal elements of the etalon based output coupler are two prisms aligned so that a first surface of one of the two prisms is parallel to a first surface of the other prism. The first of the two prisms have a second surface forming an angle with a beam from a laser cavity equal to or approximately equal to Brewster's angle. The second of the two prisms has a second surface forming an angle with the coupler exit beam equal to or approximately equal to Brewster's angle. Preferably, the prisms are comprised of $CaF_2$ and surrounded by nitrogen at about one atmosphere. Assuming the laser beam is at a wavelength of 193 nm (for ArF excimer laser), Brewster's angle is about 57 degrees and each of the first and second surfaces define an apex angle of about 34 degrees. In a preferred embodiment, the device is used as an output coupler for line narrowed ArF excimer laser having a diffraction grating based line narrowing module. The etalon based output coupler is adjusted to preferentially reflect light at or near the spectral maximum produced by the grating. Substantial improvement in line narrowing results from the amplification in the laser resonance chamber of light at or near the grating spectral maximum which is preferentially reflected by the etalon based output coupler. Several preferred methods are disclosed for tuning the etalon based output coupler to match the wavelength selected by the grating based line narrowing module.

37 Claims, 15 Drawing Sheets

DURABLE ETALON BASED OUTPUT COUPLER

This application is a continuation-in-part application of U.S. Ser. No. 08/869,239, filed Jun. 4, 1997 now U.S. Pat. No. 5,856,991; U.S. Ser. No. 08/886,715, filed Jul. 1, 1997; U.S. Ser. No. 08/926,721, filed Sep. 10, 1997 now U.S. Pat. No. 5,852,627; U.S. Ser. No. 08/987,127, filed Dec. 8, 1997 now abandoned and U.S. Ser. No. 09/204,111, filed Dec. 2, 1998. This invention relates to line narrowed lasers and especially to line narrowed excimer lasers utilizing diffraction grating and etalons.

BACKGROUND OF THE INVENTION

Techniques for Line Narrowing

Techniques for decreasing the bandwidth of the output of lasers are well known. Several such techniques used on excimer lasers are discussed by John F. Reintjes at pages 44–50 in *Laser Handbook*, Vol. 5, North-Holland Physics Publishing, Elsevier Science Publishers B. V. These techniques include the utilization of gratings, including echelle gratings for wavelength selection. Use of beam expanding prisms ahead of the grating can increase the effectiveness of the grating.

A prior art narrow band excimer laser is shown in FIG. 1. The resonance cavity of excimer laser 2 is formed by output coupler 4 (which is a partially reflecting mirror) and echelle grating 16. A portion of the laser output beam 20 (having a cross section of about 3 mm in the horizontal direction and 20 mm in the vertical direction) exits the rear of laser chamber 3. This portion of the beam is expanded in the horizonal direction by prisms 8, 10 and 12 and reflected by mirror 14 onto echelle grating 16. Mirror 14 is pivoted to select the narrow band output for laser 2. Grating 16 is arranged in Littrow configuration so that the selected narrow band of wavelengths is reflected back off mirror 14 and back through prisms 12, 10 and 8 and into chamber 3 for amplification. Light at wavelengths outside the selected narrow band is disbursed so that this disbursed out-of-band light is not reflected back into the laser chamber. Total beam expansion for this laser is about 20×. The beam has a horizontal polarization (P-polarization for the prisms with entrance surface arranged vertically). Typical KrF lasers operating in a pulse mode may have a cavity length of about 1 m and produce pulses having a duration of about 15 to 25 ns. Thus, photons within the resonance cavity will make, on the average, about 3 to 5 round trips within the cavity. On each round trip, about 90 percent of the beam exits at the output coupler and about 10 percent is sent back for further amplification and line narrowing. The beam is repeatedly line narrowed as it passes through the line narrowing module.

With this prior art arrangement, the bandwidth of the excimer laser is reduced from its natural bandwidth of about 300 pm (full width half maximum or FWHM) to about 0.8 pm for KrF lasers and about 0.6 pm for ArF lasers. Another important measure of the pulse quality is referred to as the "95% integral". This is the spectral width of the portion of the pulse containing 95% of the pulse energy. Prior art KrF laser can provide "95% integral" values of around 3 pm over the lifetime of the laser and prior art ArF lasers can provide 95% integral values of about 1.5 pm.

Some applications of KrF and ArF lasers, however, require greater narrowing of the bandwidth. For example, some micro lithography applications require smaller bandwidths such as FWHM values of 0.5 pm and 0.4 pm for KrF and ArF, respectively, and 95% integral values of 2.0 pm and 1.0 pm, respectively. The output beam of the ArF laser is about 193 nm. Very few optical materials can survive substantial exposure to this energetic light. Optical coatings for this wavelength are expensive and often short lived. The problem is even more severe for beams at shorter wavelengths such as the beam from $F_2$ lasers.

One prior art line narrowing method is to add an etalon within the resonance cavity. In this case, the etalon is operated in a transmissive mode and the light is additionally line narrowed as it passes through the etalon. In such system one should use a relatively high finesse etalon, with a finesse value f of about 1 or higher which produces sharp fringe patterns. The finesse value f is determined by the equation:

$$f = \pi r^{1/2}/(1-r)$$

where r is the reflectivity of the etalon surfaces. The dependence of etalon transmission spectrum on r is shown graphically in FIG. 2 which is extracted from page 298 of *Fundamentals of Optics* by Jenkins and White, published by McGraw Hill. From FIG. 2, it is obvious why prior art transmissive etalons used for line narrowing have surfaces with reflectance of about 50% to 80% (see curves B and C of FIG. 2). FIG. 2 also shows that it would not be practical to use curve A-type low finesse etalon as its line-narrowing efficiency in this prior art arrangement would be very low. Prior art high finesse etalons used with diffraction gratings should enhance the line-narrowing capabilities provided by diffraction grating, which, in general, improves the laser line-width. The major disadvantages of this technique are that the many reflections within the etalon tend to heat up the etalon producing thermal distortions and that the tuning of the etalon synchronously with the grating presents a real technical challenge and is difficult to accomplish in practice.

What is needed is a better technique for line narrowing and tuning of KrF and ArF excimer lasers as well as $F_2$ lasers.

SUMMARY OF THE INVENTION

The present invention provides a durable etalon based output coupler. The output coupler is especially useful for ultraviolet lasers such as an ArF excimer laser or $F_2$ laser. The principal elements of the output coupler are two prisms aligned so that a first face of one of the two prisms is parallel to a first face of the other prism and together they create a Fabri-Perot etalon. Reflection of light from these surfaces is used to create a partial beam feedback to the laser. The second face of each prism of the output coupler is aligned in such a way that the beam enters and exists the prism at a Brewster's angle or approximately at Brewster's angle. In a preferred embodiment designed for an ArF laser with a 193 nm output beam the prisms are comprised of $CaF_2$ and they are bathed in nitrogen at about one atmosphere. For this embodiment Brewster's angle is about 57 degrees and the apex angle of each prism is about 34 degrees.

The light from the laser preferably is polarized the plane of incidence; therefore this light will not be reflected from the entrance surface of the prism. Because of refraction in the prism, however, the light will exit from the prism at an angle of 90 degrees—this is an angle required for the etalon OC to reflect the light back to the laser. The portion of the light reflected from the inside parallel surfaces of both prisms will go back to the laser. The light exits the first prism at the same Brewster angle, with no reflection losses. The transmitted portion of the beam will go through the second prism, and again, will exit it at Brewster angle of about 57 degrees with no reflection. This preferred etalon output coupler has no coatings on either of its surfaces (neither reflective coatings nor anti-reflective coatings). Therefore, there are no coating losses or lifetime limitations due to failure of these coatings.

In a preferred embodiment, the device is used as an output coupler for line narrowed ArF excimer laser having a grating based line narrowing module. The etalon based output coupler is adjusted to preferentially reflect light at or near the spectral maximum produced by the grating. Substantial improvement in line narrowing results from the amplification in the laser resonance chamber of light at or near the grating spectral maximum which is preferentially reflected by the etalon based output coupler. A method is disclosed for tuning the etalon based output coupler to match the wavelength selected by the grating based line narrowing module.

DETAILED DESCRIPTION OF THE PREFERRED EMBODIMENTS

First Preferred Embodiment

Figure 3:
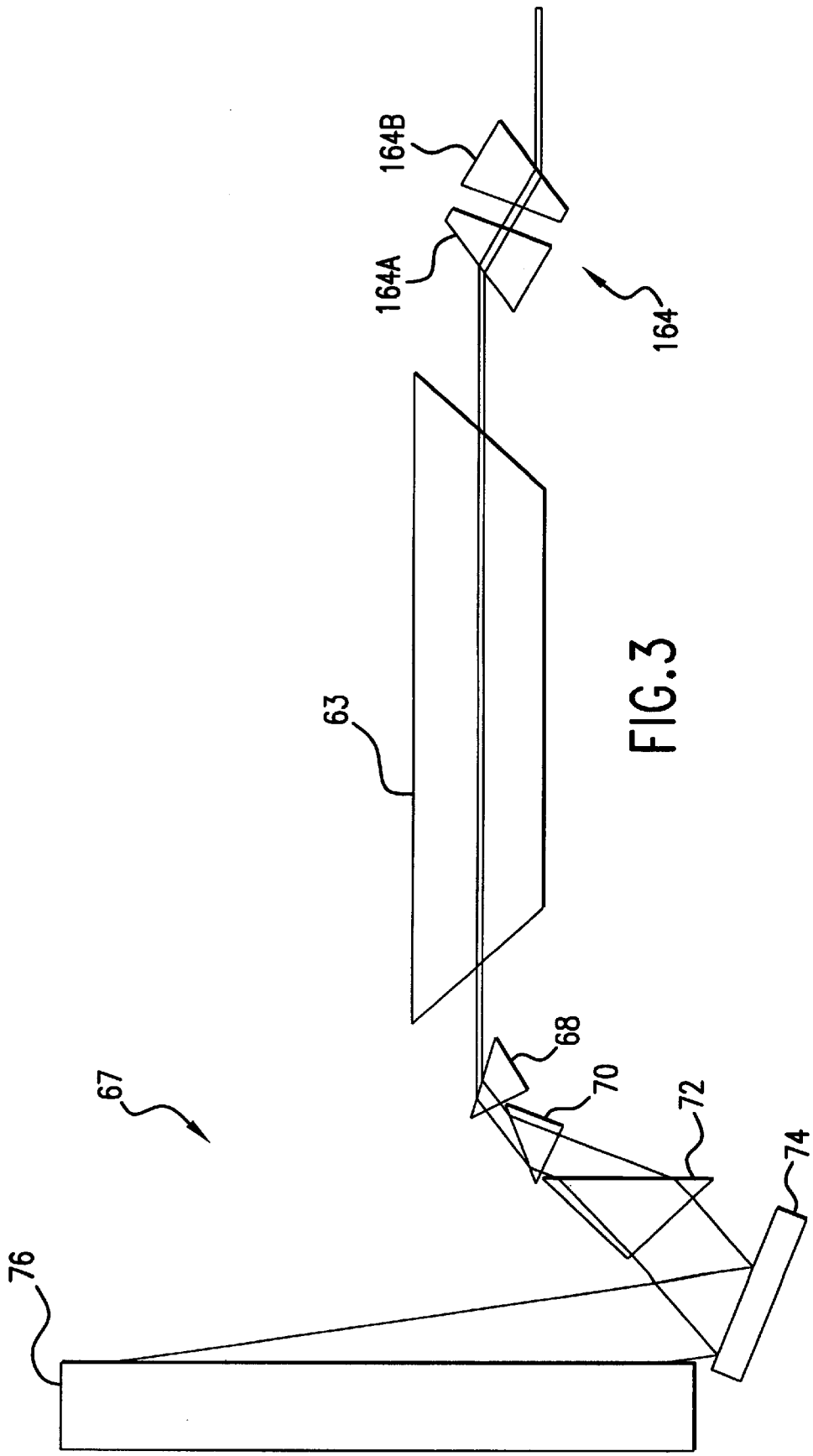
FIG. 3 shows first preferred embodiment of the present invention.
Figure 8:
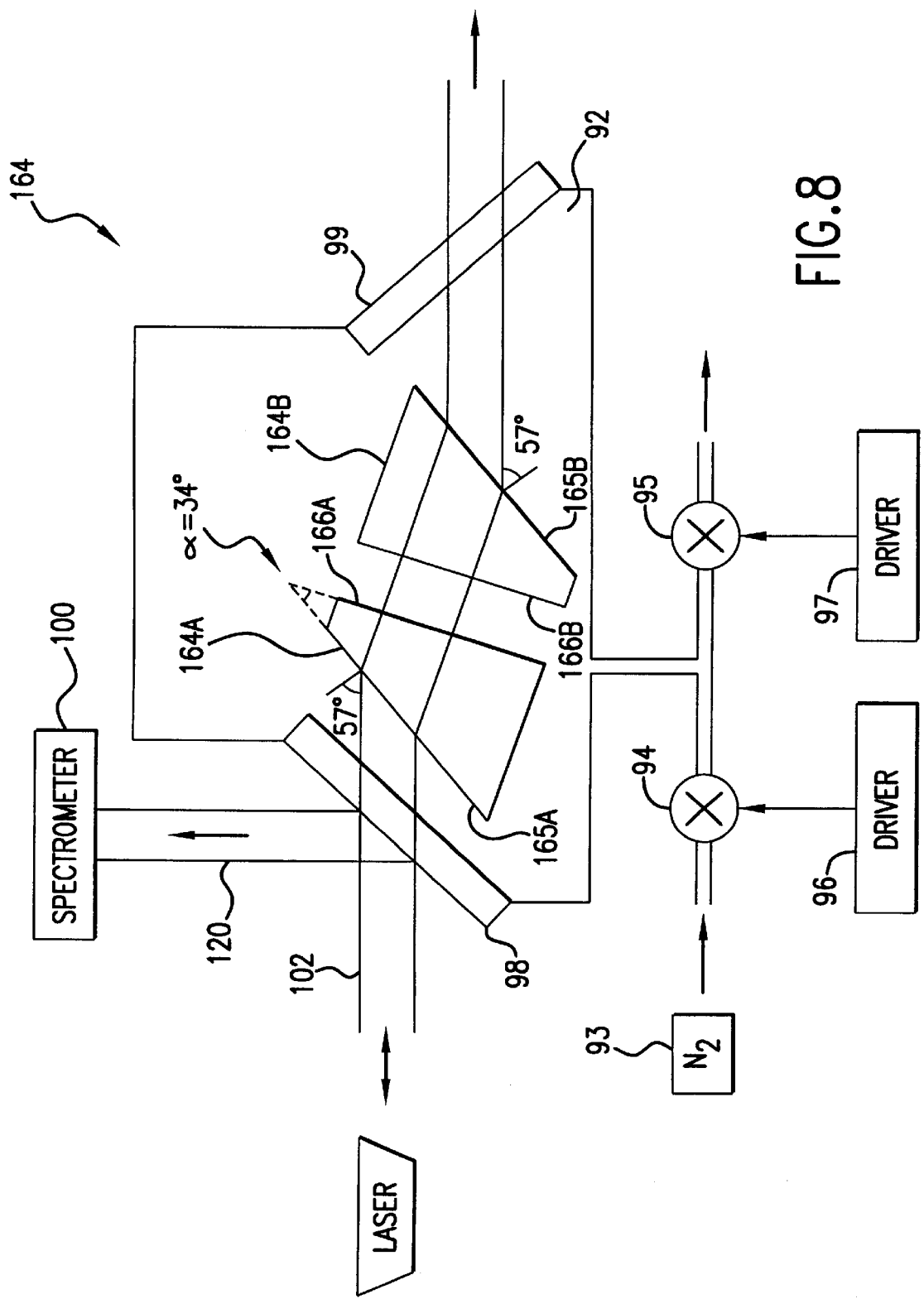
FIG. 8 is a sketch of preferred tunable etalon output coupler.

A first preferred embodiment of the present invention is shown in FIG. 3. This embodiment shows a durable etalon based output coupler 164 used with an ArF laser chamber 63 having a line narrowing module 67 with a tuning mirror 74, grating 76 and a three prism beam expander comprising prisms 68, 70 and 72. In this preferred embodiment, the prism material is $CaF_2$ and the prisms enclosed in a nitrogen atmosphere at just slightly above 1.0 atmosphere as shown in FIG. 8. Referring now to FIG. 8, the beam 102 enters the first prism 164A at an angle of about 57 degrees which is close to Brewster's angle. Therefore, for the beam 102 polarized in the plane of incidence, there will be no reflection from the first surface 165A of prism 164A. The apex angle of prism 164A is 34 degrees. Therefore, because of refraction of the beam 102 on surface 165A, the propagation direction of beam 102 is changed, so it will cross the second surface 166A of prism 164A at an angle of 90 degrees. The position of the prism is finely aligned so that this angle is exactly 90 degrees. The beam 102 enters the second prism 164B at exactly the same 90 degree angle with surface 166B as surfaces 166A and 166B are parallel to each other. Beam 102 will have another refraction at the second surface 165B of prism 164B, so that the existing beam will make a Brewster's angle of about 57 degrees with the surface 165B. The apex angle of prism 164B is again about 34 degrees. None of the surfaces of prisms 164A and 164B has any coatings. Windows 98 and 99 are positioned at angle close to Brewster's angle if no reflection is desired from them. Or, as shown in FIG. 8, if a window (in this case window 98) is used to sample a portion of the beam 102, the angle could be a little less than Brewster's angle. Therefore, the preferred embodiment has no coatings on any of its surfaces.

Each of the inside parallel surfaces of the prisms has a reflectivity of about 4 percent for normal 193 nm light. These surfaces reflect a portion of beam 102 back to the laser.

More generally where the prism material has an index of refraction $n_m$ and the adjacent gas has an index of refraction $n_a$, the apex angle of the prism is such that $$\sin\alpha = \frac{1}{\sqrt{1 + (n_m)^2/(n_a)^2}}. \quad (1)$$

if the prism material is $CaF_2$ with $n_m=1.50153$ and the surrounding gas is nitrogen at about one atmosphere with an $n_a=1.0003$, then, =33.67 degrees.

Tunable Etalon as Output Coupler

Figure 1:
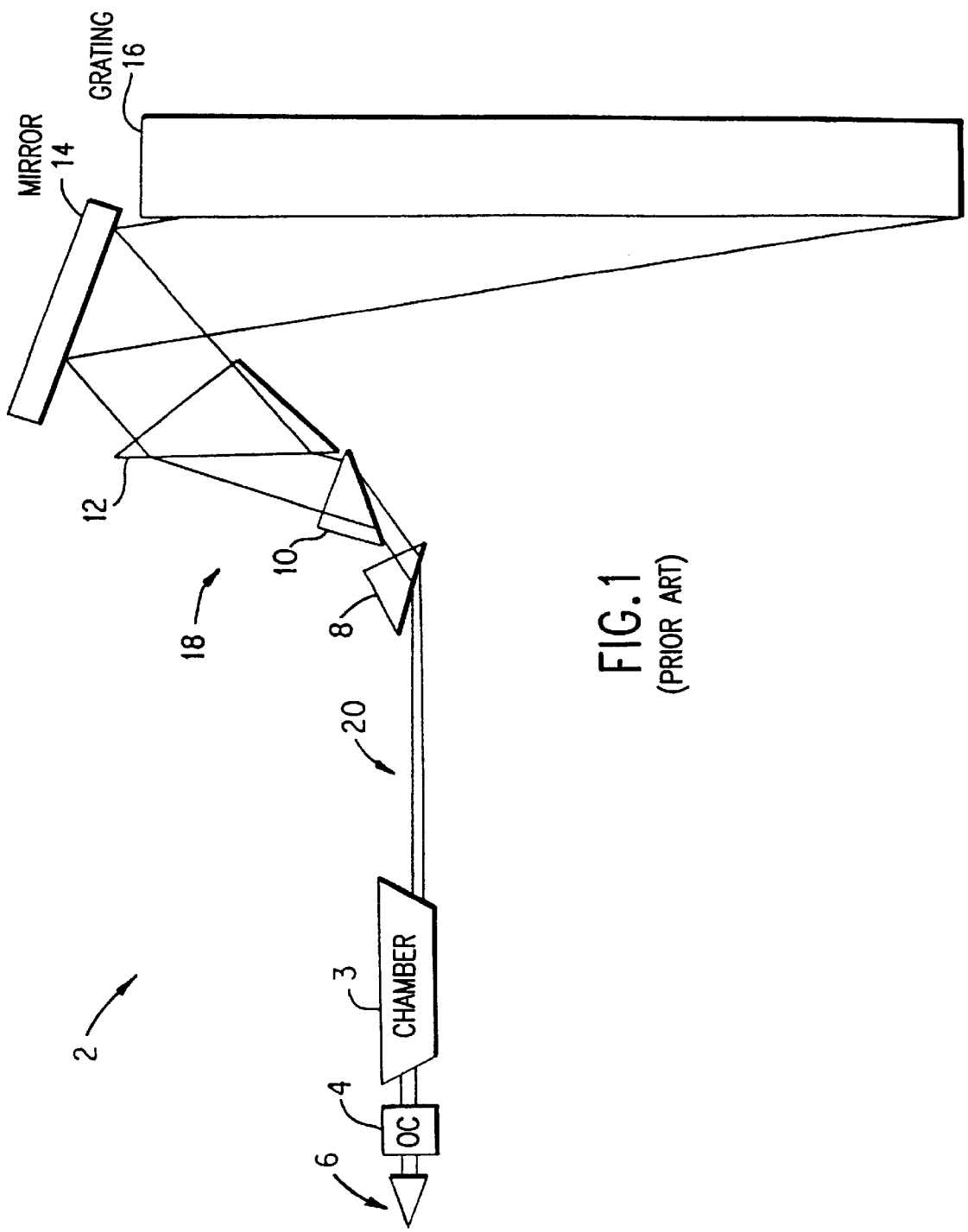
FIG. 1 shows a prior art line-narrowed laser.
Figure 2:
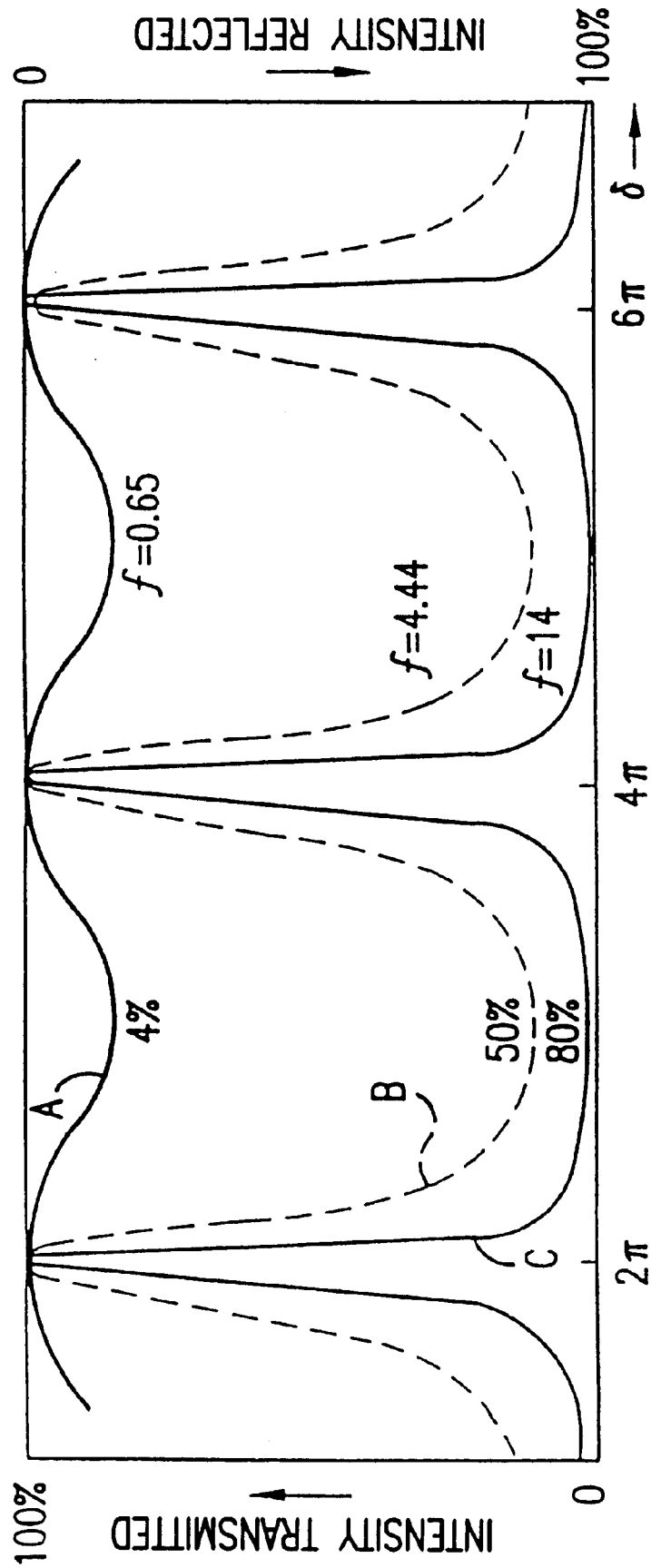
FIG. 2 shows the percent of light transmitted by an etalon as a function of the reflectance of the two inner etalon surfaces.
Figure 6:
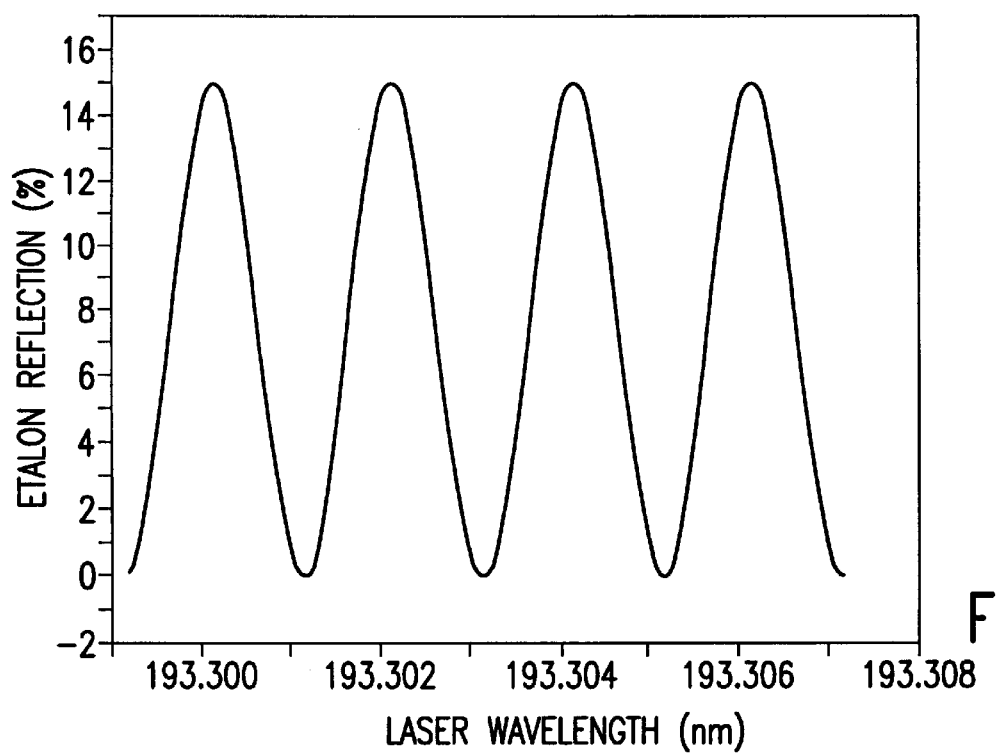
FIG. 6 shows a reflectivity of the etalon OC in dependence on wavelength.
Figure 7:
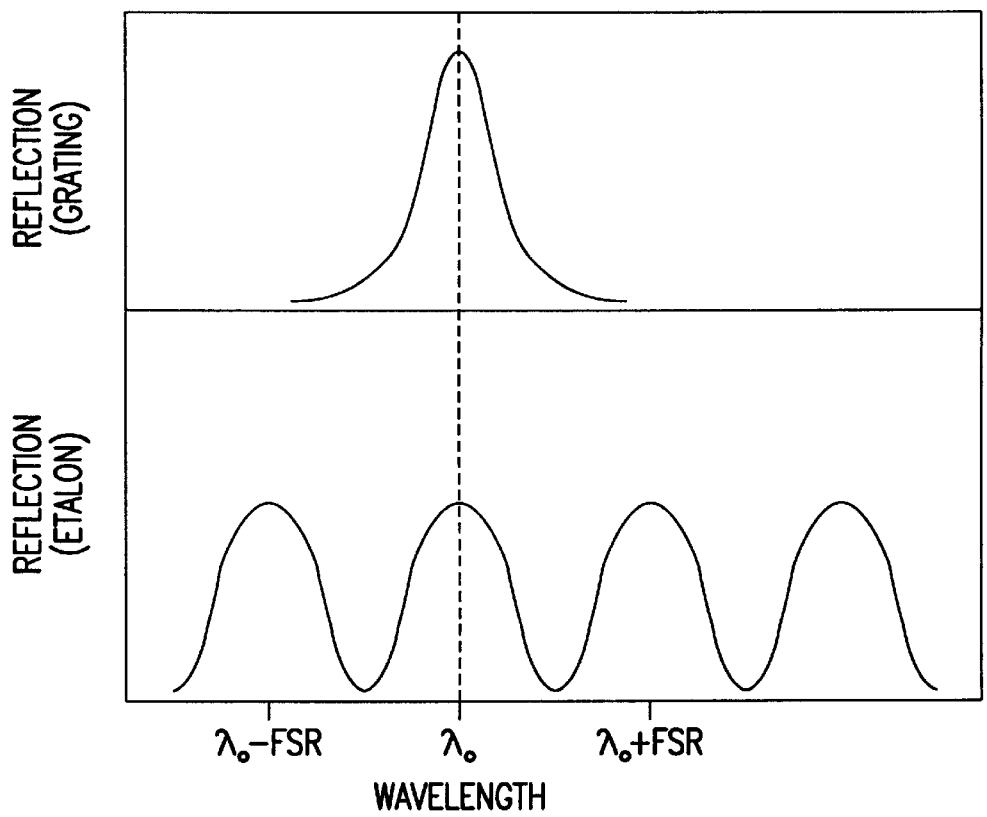
FIG. 7 shows relative positions of maximum reflectivity for line-narrowing module and etalon OC.

As stated above, the preferred etalon output coupler has a reflectivity of the plates of about 4% for normal 193 nm light. In this embodiment, the gas is nitrogen with an n of 1.0003. The gap size is about 9 mm and the wavelength is about 193 nm. In this case, the total reflectivity of the etalon is determined by an interference of the light waves reflected from both parallel surfaces and is shown in FIG. 6 as a function of wavelength. For comparison curve A in FIG. 2 shows transmission of the same etalon. The minimum reflection is about 0% and the maximum is about 15%. If one of the reflection peaks is matched to the grating maximum, then about 15% of the light at the grating maximum is reflected back to the laser (85% is transmitted). Substantially all of the portion of the beam which is higher or lower in wavelength than the grating maximum by about 1 pm are not reflected at all. Higher reflectivity of etalon output coupler at one wavelength and its reduced reflectivity at other wavelengths, will cause the laser to preferably generate light at the wavelength of higher reflectivity. Therefore, the etalon output coupler works as a line narrowing device. Light which deviates from the grating maximum by about 2 pm would be reflected at about 15%. However, the grating is effective in controlling about 95% of the light to within about 1.5 pm of the grating maximum. Therefore, for the best line-narrowing, one of the maximums of the etalon reflection should be at the same wavelength as the maximum reflection of the grating in line narrowing module as shown in FIG. 7. In this case, the laser will generate at the central wavelength $\lambda_0$, and it will have the minimum line-width as wavelength selection effect of the etalon adds to the wavelength selection effects of the grating.

Positions of etalon peaks are determined by:

$$\lambda_n = \frac{2nd}{N}, \qquad (2)$$

where: N=is interference order, which can be any positive integer value $\lambda_n$=is the position of the peak corresponding to an etalon interference order, N, in the gap n= refractive index of the gas between the plates, and d=size of the gap.

For example, if n=1.0003 and d=9 mm, then an N=93,147 will give a peak at 193.3009 nm, while N=93,099 will give a peak at 193.4006 nm. Each increment of N, by one, will produce a new peak shifted by approximately 2 pm. Because there is a large number of peaks, each separated by approximately 2 pm from its closest neighbor, there is always a peak available close to any position of the grating. Thus, it is a fairly simple matter to tune the grating to an etalon peak.

Alternatively, as follows from equation (2), if we fix the value of N, the position of the peak corresponding to that N can be slightly changed by changing either n or d. This way, the etalon can be tuned, so that one of its peaks matches position of the grating. Both techniques for etalon tuning are known in the prior art. n value can be changed by changing pressure of the gas between the plates, as the refractive index n and gas pressure are related according to:

$$n = 1.0 + k \cdot p \qquad (3)$$

where k is a coefficient depending on gas and wavelength. For Nitrogen, for example, $k=3.94 \cdot 10^{-7}$/Torr. So a pressure change of about 1 Torr will shift the peak by about 0.1 pm.

Another way to shift peaks is to change d using, for example, piezoelectric adjusters which can precisely move one plate relatively to another. For example, a change in the gap of about 0.01 micron will shift the peak by about 0.215 pm.

Preferably, when the laser wavelength needs to be changed from $\lambda_0$ the mirror 74 (FIG. 3), is pivoted to a very slightly different angle, thus moving the maximum of diffraction grating reflection to a different wavelength $\lambda_0'$. The etalon output coupler then needs to be tuned also, so that the new center wavelength $\lambda_0'$ coincides with one of the etalon maximums. This as explained above can be done by changing the nitrogen pressure inside the etalon or by changing the spacing between the prisms.

The reader should understand that this etalon is considerably different from the more conventional "transmissive" etalon. In the latter case, the reflectivity of the parallel plates is chosen between 20% and 99% of the light, and the line-narrowing is done for the transmitted light through the etalon. The multiple reflections (about 3 to 50) of the light between the parallel plates greatly increases the light intensity inside the etalon, thus causing a number of serious problems when high power laser operation is required. Such problems include, for example, thermal distortions of the beam, failure of the reflective coatings, etc. All these problems are insignificant in the etalon output coupler of the present invention because there is very little multiple reflection of the light between the parallel plates. Instead, substantially single reflection from one plate interferes with substantially single reflection from the other plate. Moreover, the preferred reflectivity value of 4 percent can be achieved by using uncoated plates made of fused silica or $CaF_2$, using the Fresnel reflection from the etalon surfaces. This reduces the probability of etalon failure due to coating failure and increases the etalon output coupler lifetime.

Etalon Design

Figure 4:
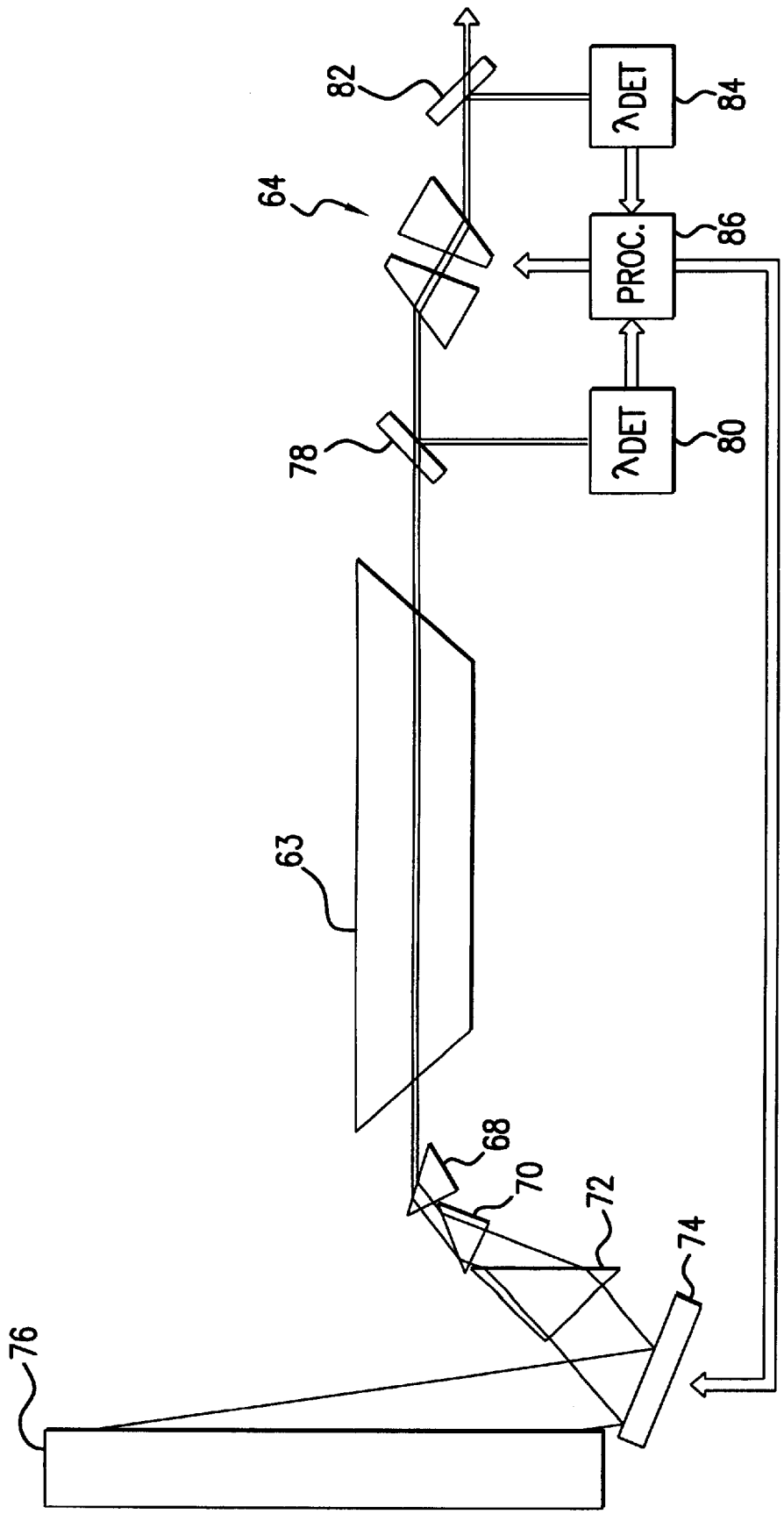
FIG. 4 shows some features of line-narrowed laser with etalon output coupler and diffraction grating based line-narrowing module.
Figure 5:
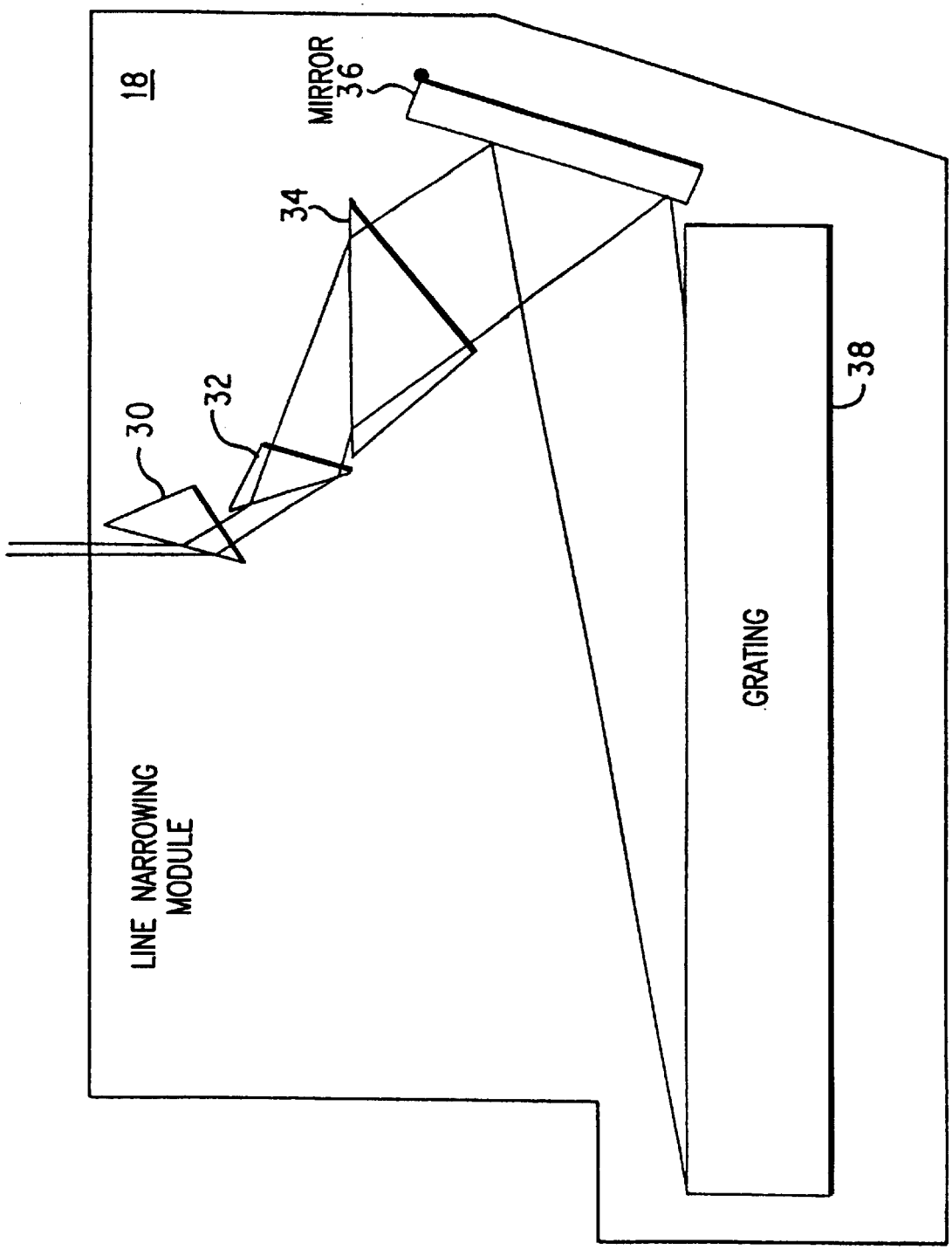
FIG. 5 shows a diffraction grating-based line-narrowing module.
Figure 9:
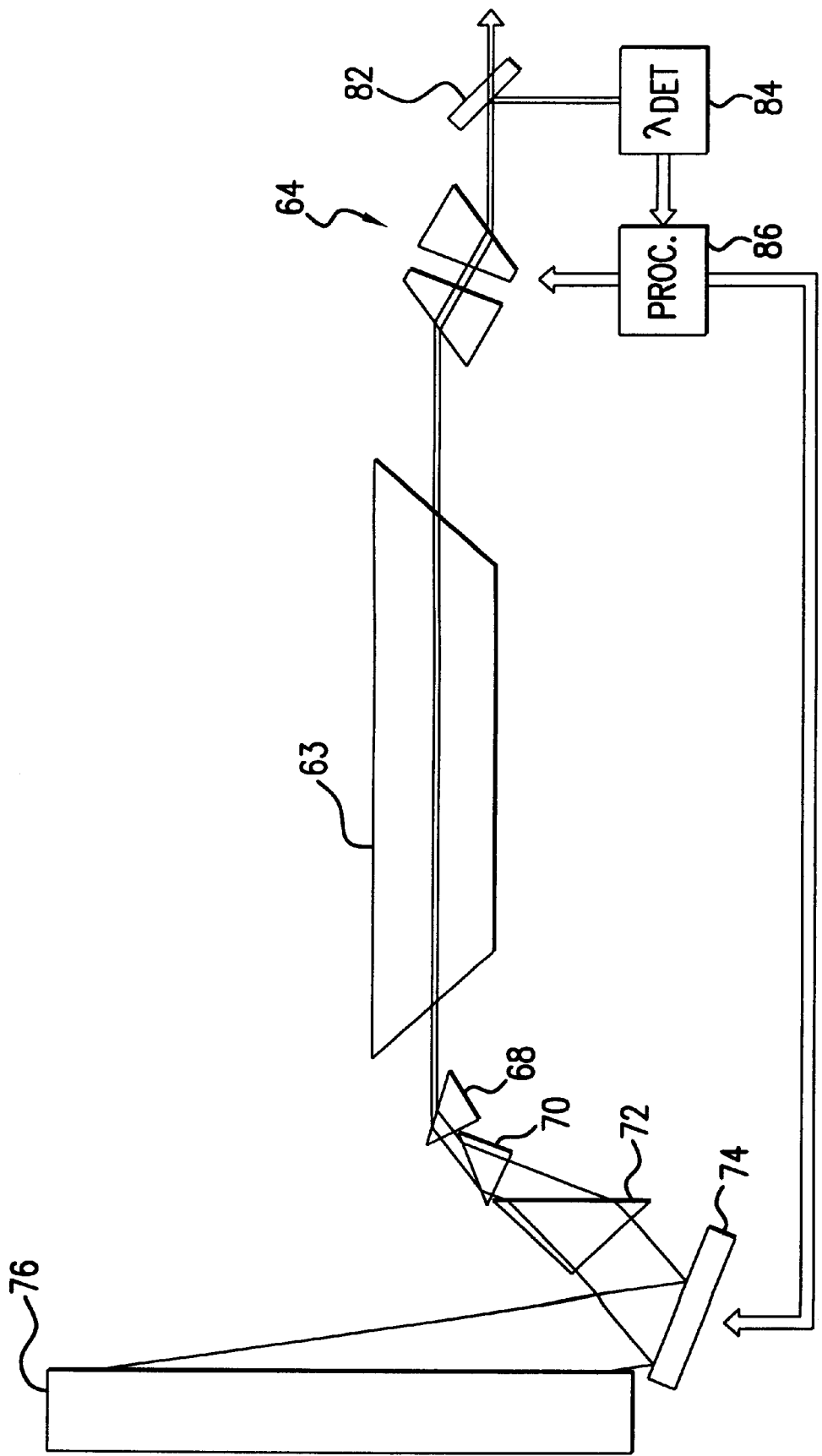
FIG. 9 is a drawing of alternative preferred embodiment.

FIG. 8 shows a preferred tunable etalon design. The etalon 164 comprises prisms 164A and 164B separated by three fused silica spacers (not shown) optically contacted to the plates using well known prior art techniques. The etalon is tuned by increasing or decreasing nitrogen pressure in pressure chamber volume 92 using nitrogen from a 30 psi source 93, inlet valve 94 and outlet valve 95 controlled by electronic drivers 96 and 97 which are in turn controlled by processor 86 as shown in FIG. 4 or FIG. 9. Light from the laser enters through $CaF_2$ windows 98. Part of the beam is reflected back toward the laser as described above and most of the light is transmitted through $CaF_2$ window 99 as the output beam. Reflection from the incoming and outgoing surfaces of each of the prisms is approximately zero. About 2% of the light from the laser is reflected by mirror 98 to spectrometer 100 which analyzes the spectrum and reports the results to processor 86 (not shown). The reader should note that the etalon described here can be used in the other configurations shown in FIGS. 4 and 9 with obvious minor modifications.

Preferred Techniques for Aligning the Etalon for Required Wavelength

Preferred Alignment Technique

A preferred alignment technique is shown in FIG. 4. The laser spectrum is analyzed to derive information on misalignment of the etalon output coupler relative to line-narrowing module. First, the laser beam spectrum is analyzed by spectrometer 80 to first look for two separate peaks in the light reflected back toward the chamber from the etalon output coupler 64. Two peaks (a large one and a small one) would result from gross misalignment of the output coupler and the line narrowing module. If there is only one peak, this means that any misalignment is only minor. In this case, the spectrum is analyzed to look for a distortion which would result from a small misalignment. If misaligned, the output coupler is tuned to match the wavelength selected by the grating. This is preferably done by increasing the gas pressure between the etalon plates or by changing the spacing between the two etalon plates.

Figure 12A:
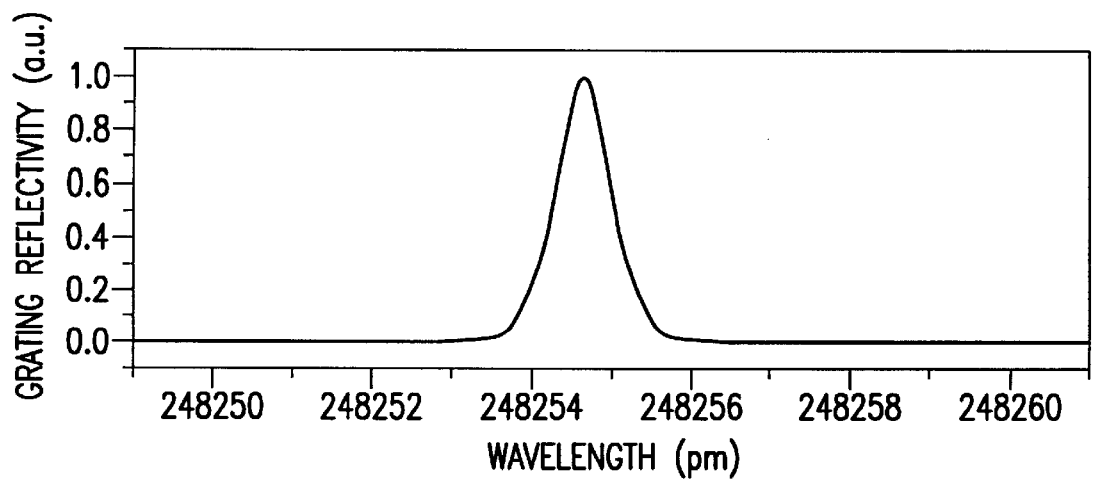
FIGS. 12A, B and C demonstrate a gross misalignment.
Figure 12B:
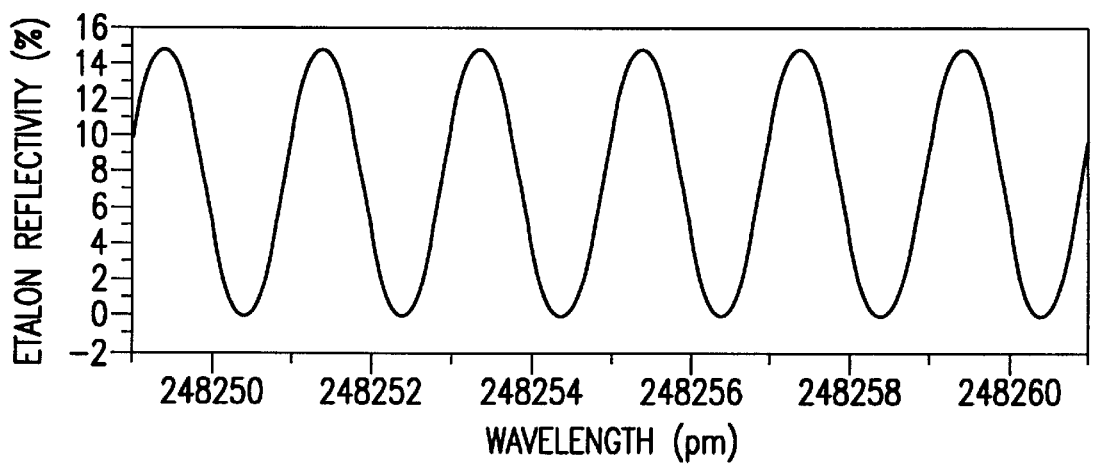
Figure 12C:
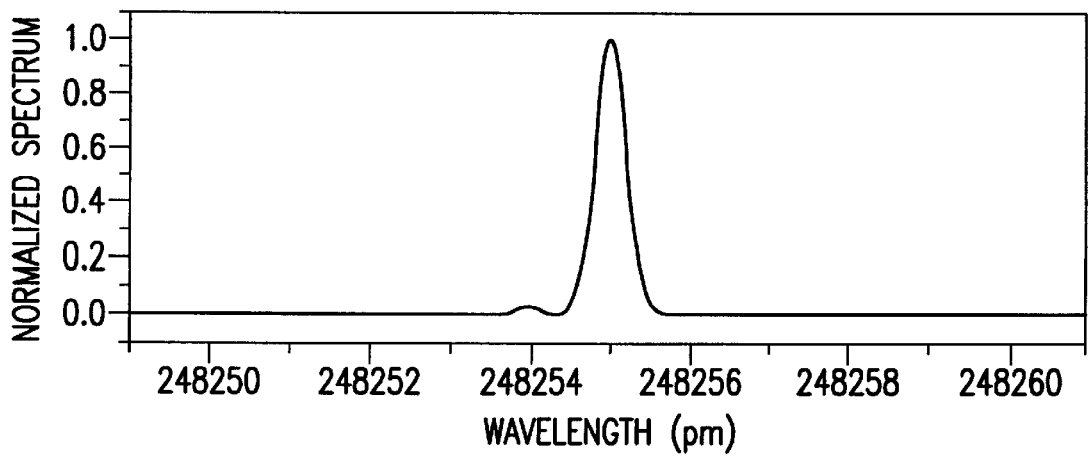
Figure 13A:
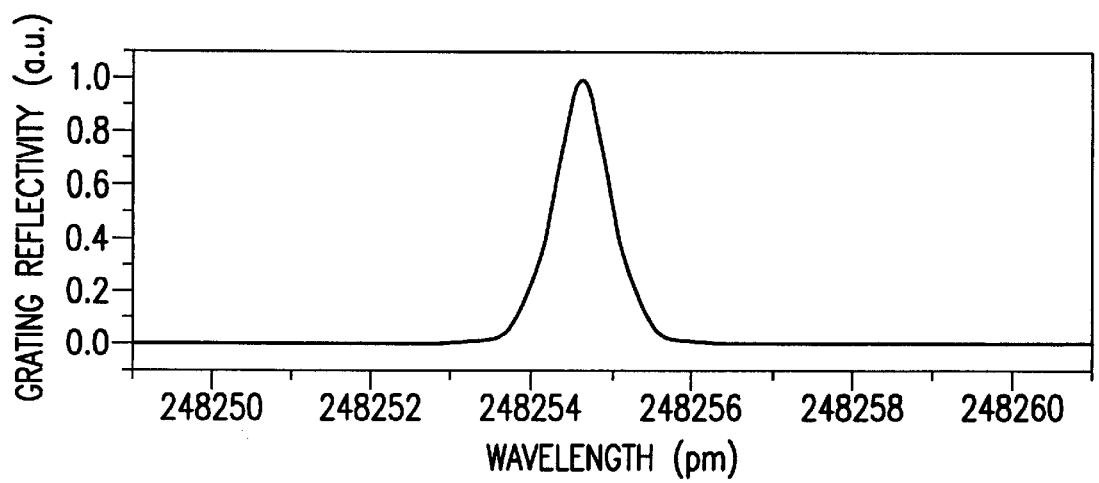
FIGS. 13A, B and C demonstrate a gross misalignment.
Figure 13B:
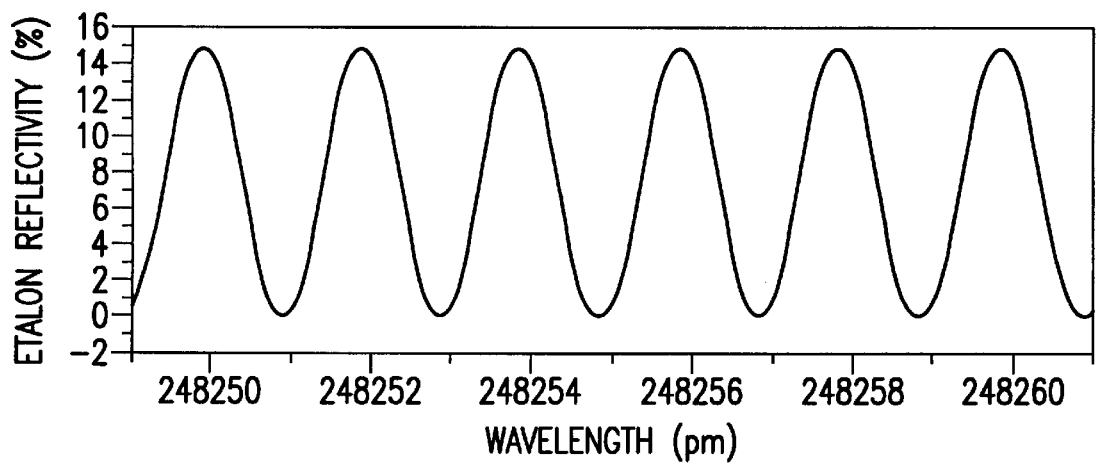
Figure 13C:
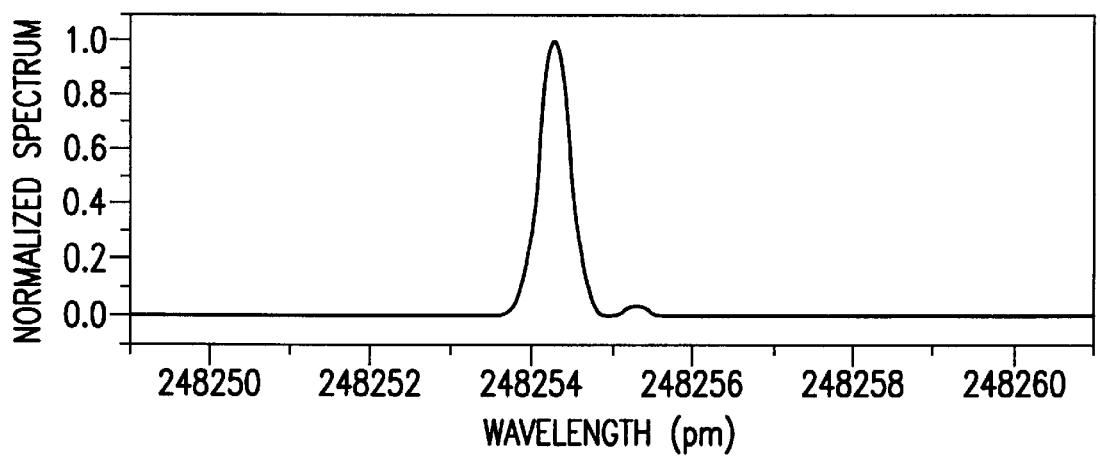

As shown in FIG. 4, the laser is first approximately tuned to a desired wavelength using a prior art wavemeter 84 as described in U.S. Pat. Nos. 5,025,445 or 5,420,877 to tune the grating based line narrowing module with tuning mirror 74. At the output side of the laser a small portion (such as about 2 percent) of the light reflected by etalon 64 is directed by beam splitter 78 to spectrometer 80 which measures the spectrum of this reflected light. Spectrometer 80 could be any prior art spectrometer capable of spectral measurement in the 248 nm range (for KrF) or the 193 nm range (for ArF) with accuracies in the range of 0.1 pm or better. Such spectrometers are described in detail in U.S. Pat. No. 5,025,445 or U.S. Pat. No. 5,420,877 which are incorporated herein by reference. In the process of tuning the etalon output coupler 64 to the grating based line narrowing module, there are two cases to consider: the etalon is grossly misaligned, and the etalon is slightly misaligned. Lets consider the case of gross misalignment first. In this case, the position of the closest maximum of the etalon is shifted from the position of diffraction grating maximum by a value, comparable with the width of the maximum itself. It should be pointed out, that because there are a multitude of the etalon maximum peaks, the maximum misalignment of the etalon cannot be more than half of the etalon free spectral range. In the preferred embodiment of ultra-narrow ArF excimer laser the etalon FSR is about 2 pm. Therefore, the maximum misalignment of the etalon is about 1 pm. FIG. 12A shows a position of grating maximum, and positions of the etalon maximums are depicted in FIG. 12B for a large misalignment, where the closest etalon maximum is shifted by about 0.75 pm in the direction of longer wavelengths relative to the spectrum. FIG. 12C shows the generated laser spectrum in this situation as would be measured by spectrometer 80. This spectrum is a result of convolution of the etalon reflection curve and grating reflection curve, with this convolution taken to the power equal to the average number of round trips of the light in the cavity, which is about 2. The spectrum has a stronger peak and a weaker peak. The stronger peak is at longer wavelength values as compared to the smaller peak. The spacing between the peaks is about 1 to 1.5 pm. FIGS. 13A, B and C show the situation where closest etalon maximum is shifted by 0.75 pm towards the shorter wavelengths relative to the grating maximum. This situation is symmetrical to the one shown in FIG. 12C, but now the larger peak is at shorter wavelength values as compared to smaller peak.

Therefore, if a double peak is detected, the appropriate correction will depend on the relative position of the larger and smaller peaks. If the larger peak is at longer wavelength values as compared to the smaller peak, the nitrogen pressure of etalon output coupler should be decreased by about 6 Torr to shift the etalon peaks by about −0.6 pm. (Notice that an increase in the pressure of about 14 Torr would also align the OC and the grating.)

The largest ratio of the magnitude of larger and smaller peaks, which can still be identified as a double peak structure is determined by the noise level in the system. In the experiments, done by the Applicant, the minimum amplitude of the smaller peak, which could still be reliably identified as a double peak structure was set at about 5% relative to the maximum amplitude of the peak.

Figure 14A:
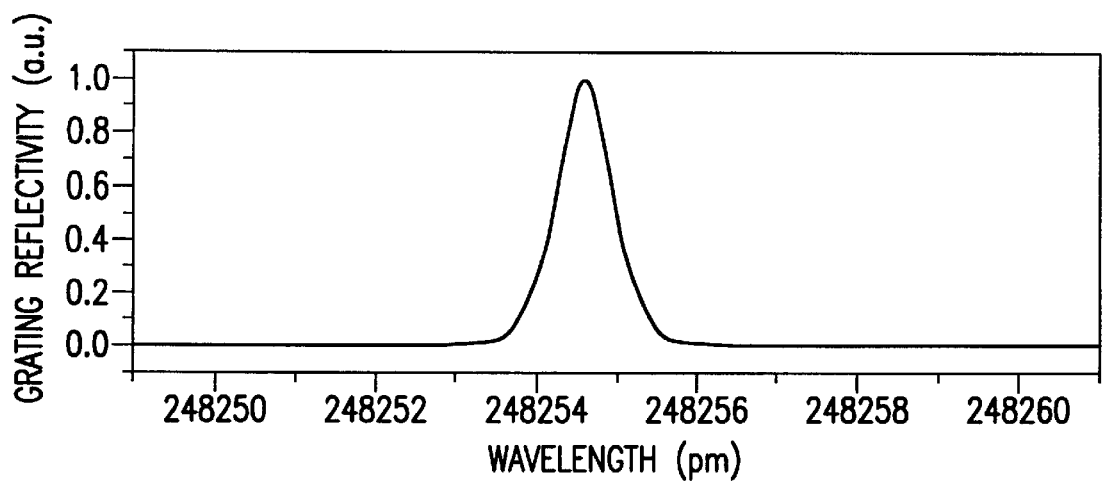
FIGS. 14A, B and C demonstrate a small misalignment.
Figure 14B:
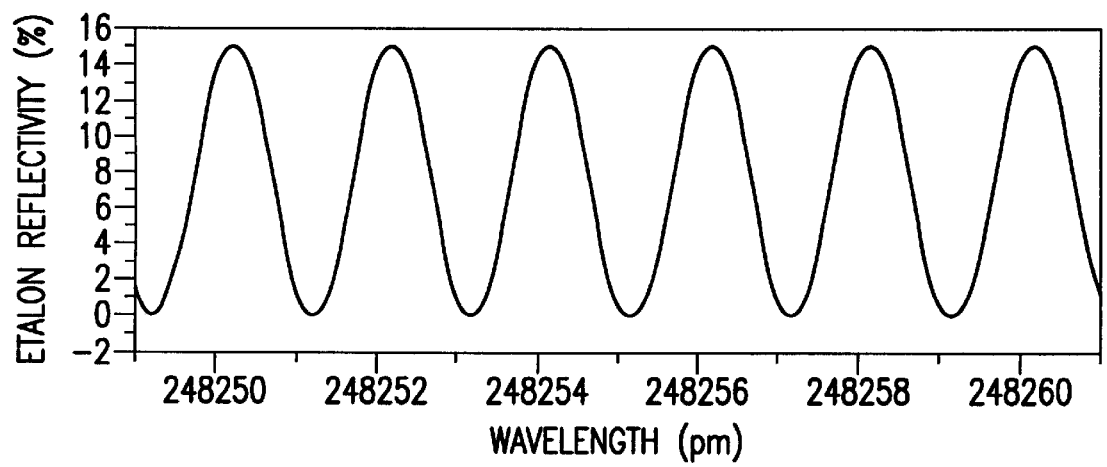
Figure 14C:
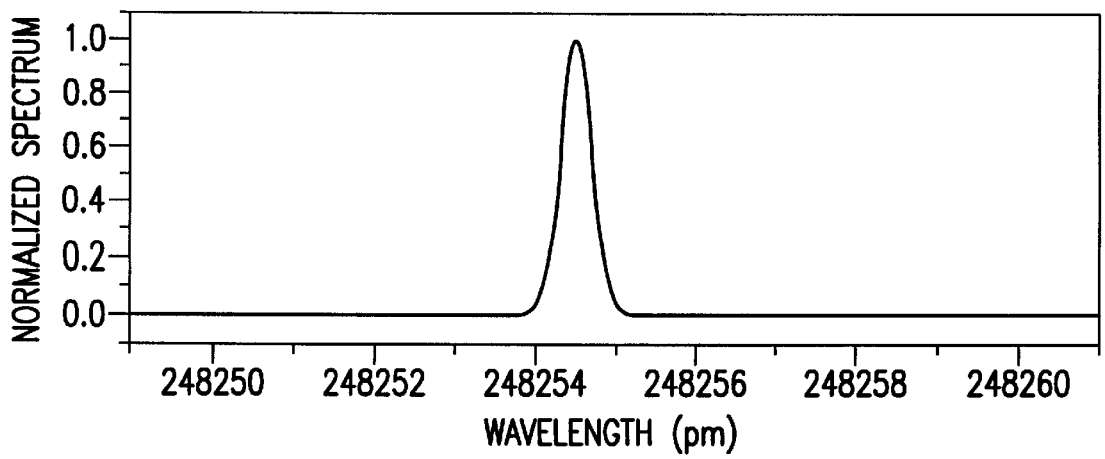
Figure 15A:
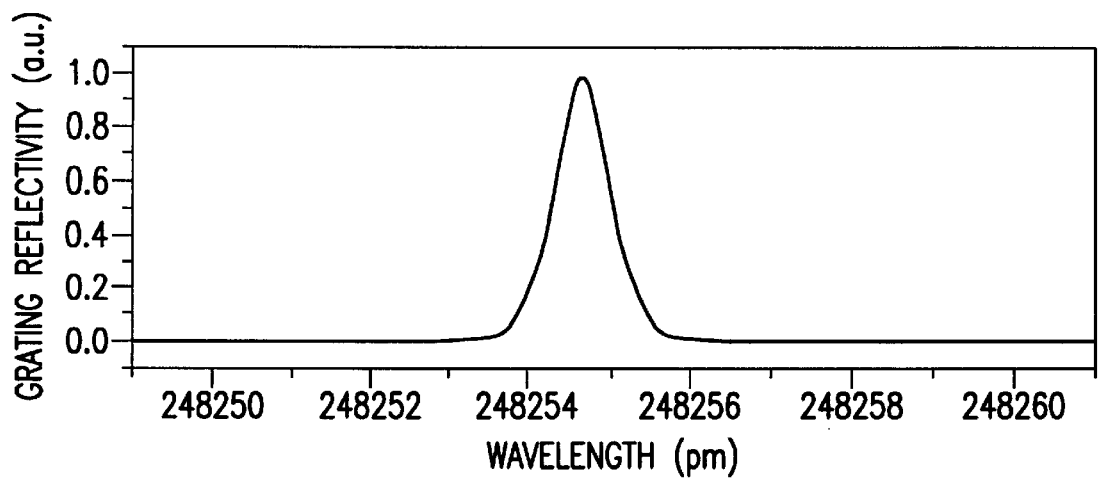
FIGS. 15A, B and C demonstrate a small misalignment.
Figure 15B:
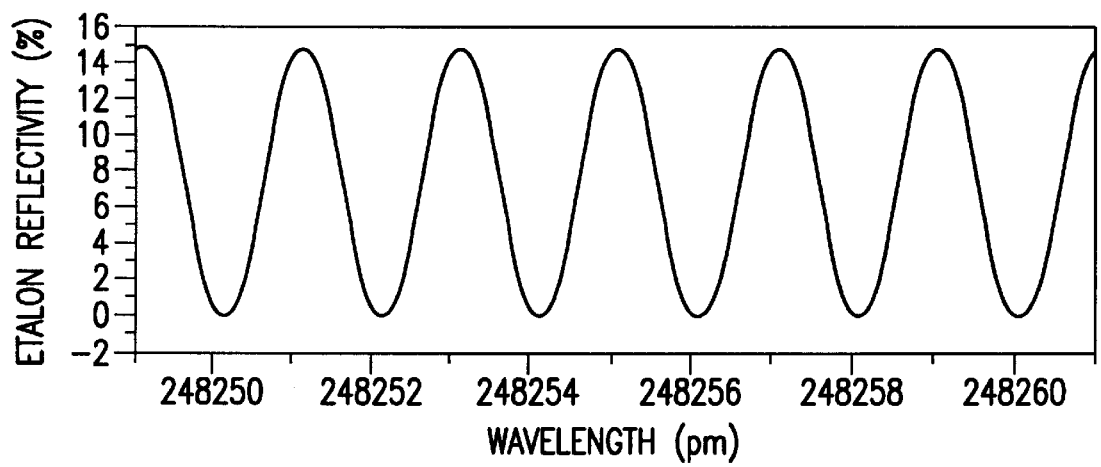
Figure 15C:
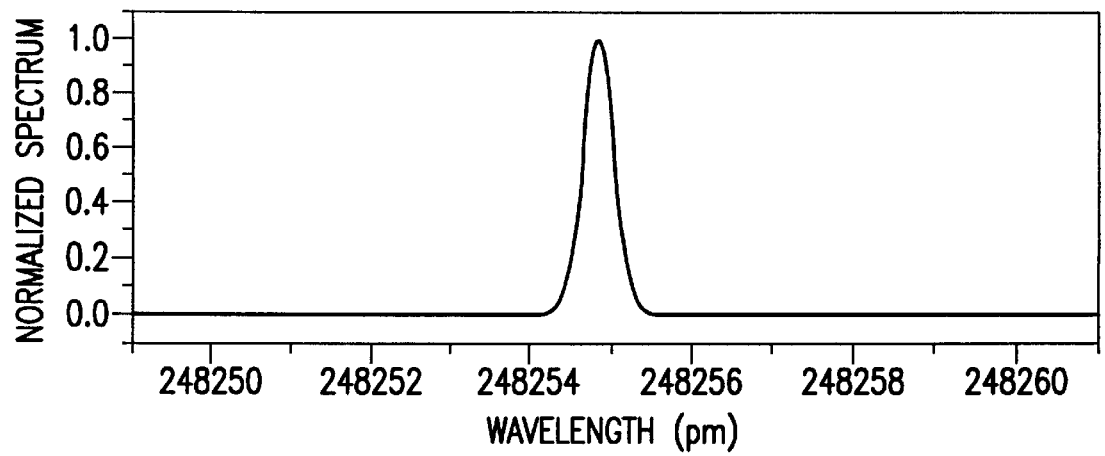

As controller 86 (FIG. 4) corrects the gross misalignment of etalon and diffraction grating, the smaller peaks get smaller and smaller, and at some point it is no longer detectable. This situation is shown in FIGS. 14A, B and C and FIGS. 15A, B and C. FIGS. 14A, B and C show the case, when the closest etalon maximum is shifted to the shorter wavelengths by about 0.45 pm relative to the grating maximum. FIG. 14C shows the laser spectrum in this situation. The spectrum does not have second bumps, but does have an asymmetry in it, with the extended tail going into the shorter wavelength region. FIG. 15C shows the case when the OC maximum is shifted towards longer wavelength relative to the grating maximum by about 0.45 pm. This produces an asymmetric spectrum with an extended tail into the longer wavelength region.

Figure 16:
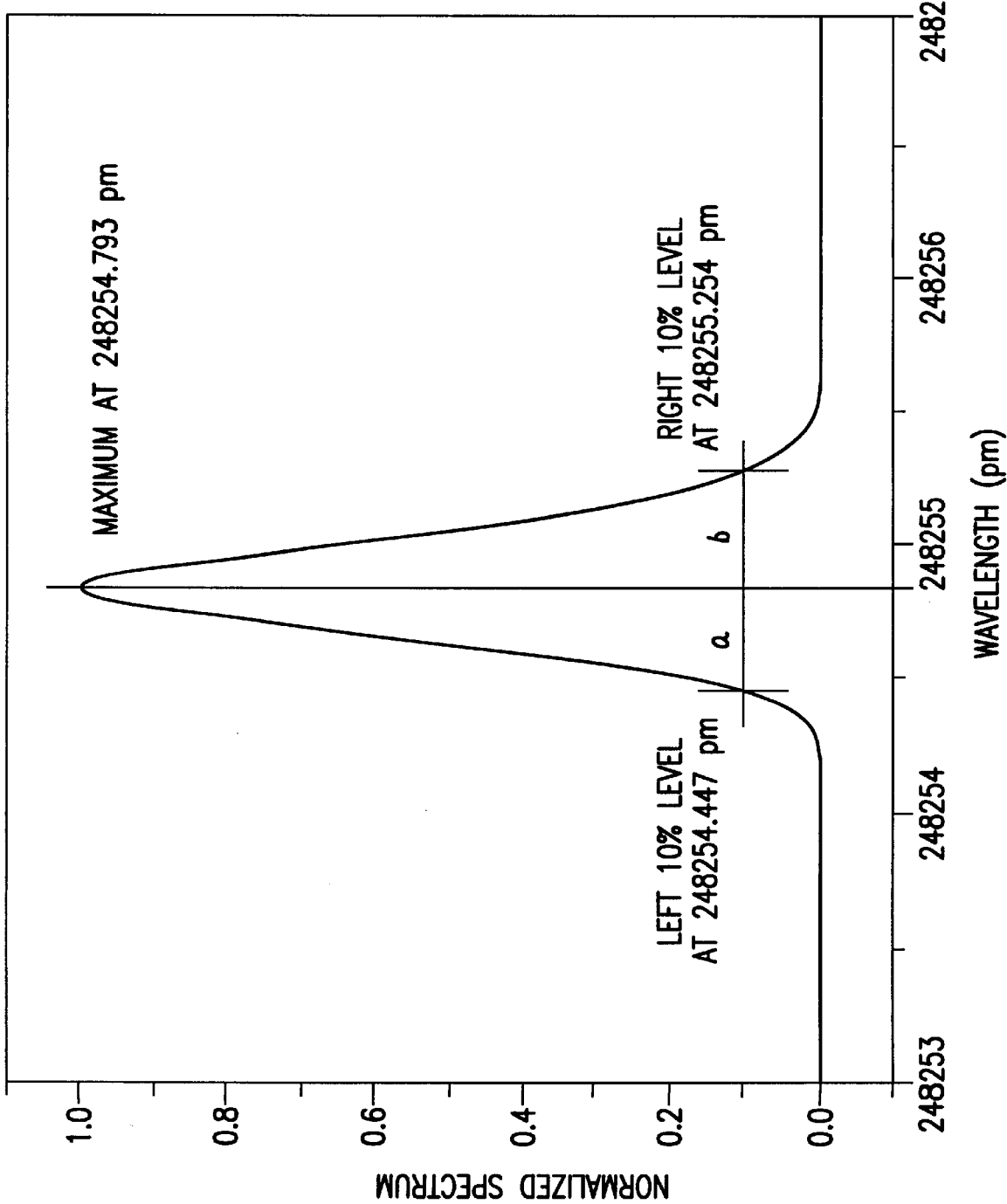
FIG. 16 shows asymmetry of the spectrum.

This asymmetry of the spectrum is analyzed by controller 86 (FIG. 4) and used to generate the etalon correction signal. If asymmetry extends towards longer wavelengths, like in FIG. 15C, the pressure in the etalon output coupler should be reduced very slightly to slightly reduce the wavelengths of the etalon maximums. If, the asymmetry extends towards the shorter wavelengths, the pressure in the etalon output coupler should be increased slightly. This would provide a very accurate control of the etalon tuning, allowing the peak of the etalon to be tuned to within about 0.1 pm or better relative to the peak of diffraction grating. There are many ways known in the prior art to analyze the asymmetry of the spectrum. In the preferred embodiment, the assymetry is determined at 10% level as shown in FIG. 16. In this technique, three values are used: position of the maximum, and positions at 10% level on both sides from the maximum. Then the distances a and b are calculated, where a is the distance between the maximum and the 10% level position on the shorter wavelength side of the spectrum, and b is the distance between the maximum and the 10% level position on the longer wavelength side of the spectrum. The asymmetry h of the spectrum is then calculated as $$h=(b-a)/(b+a)$$

Figure 11:
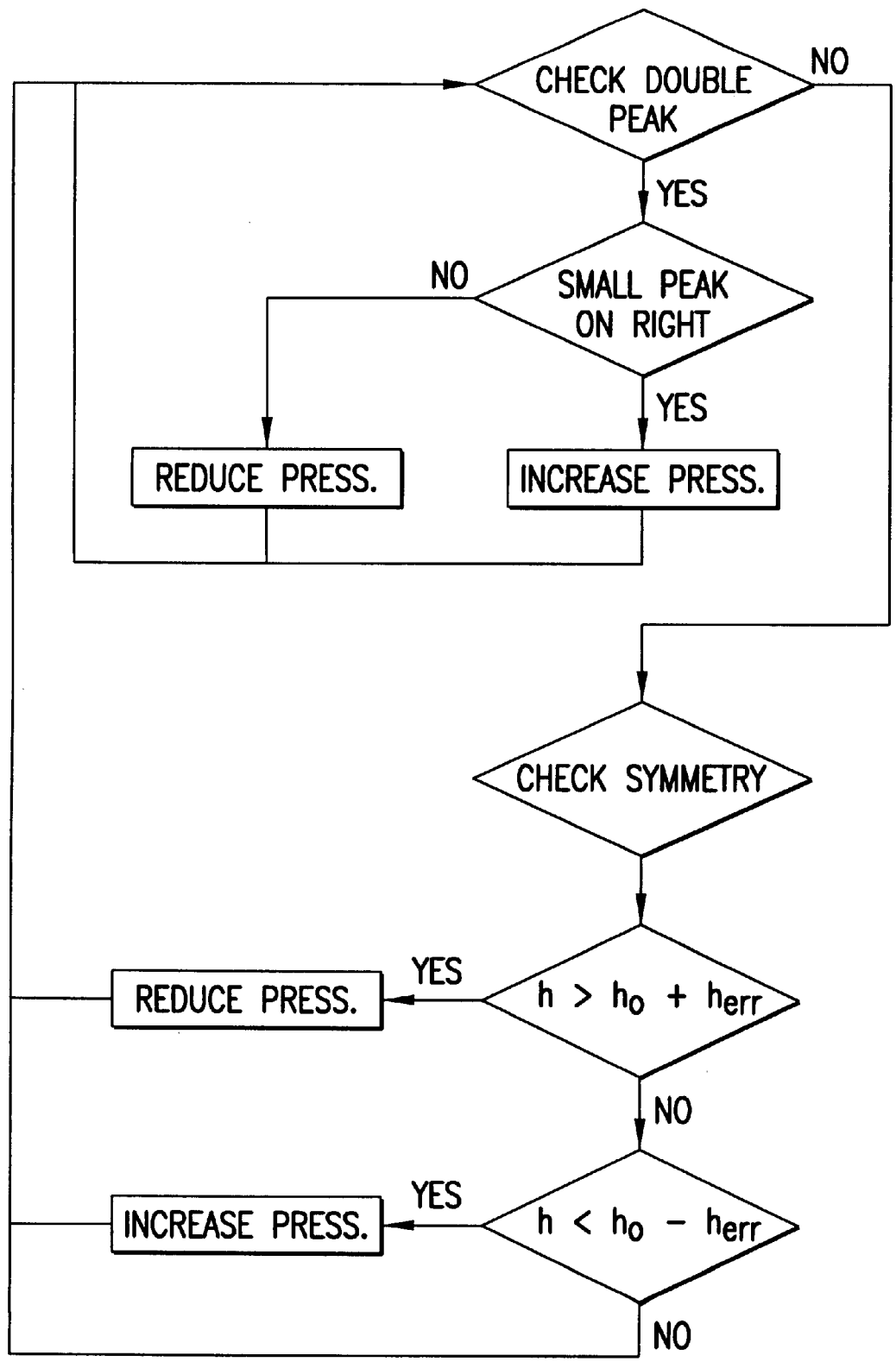
FIG. 11 is a flowchart showing how to correct a misalignment.

The value of asymmetry h is used by controller 86 (FIG. 4) to control the pressure in the EOC. This value is compared with the target value $h_0$ and allowable error $h_{err}$. If $h<h_0-h_{err}$, then the pressure should be increased, if $h>h_0+h_{err}$, then pressure should be reduced. Otherwise, etalon is considered tuned to the laser. For example, the value $h_0$ can be set to 0, and $h_{err}$ can be set to 0.05 (about 5% asymmetry). Spectrum, shown in FIG. 16 has a=0.346 pm and b=0.461 pm. That means, its assymetry value is h=0.143, which is larger than $h_0+h_{err}$, which means, the pressure of the etalon output coupler should be reduced (by about 1 Torr). The reduction of the pressure will shift the etalon maximum towards the shorter wavelengths, which will reduce the asymmetry of the spectrum. The asymmetry of the spectrum is measured again, and correction can be repeated if needed. The flow chart implementing this algorithm is shown in FIG. 11.

Second Preferred Alignment Technique

Another embodiment of the present invention is shown in FIG. 9. In this embodiment, only one spectrometer 84 is used, which provides the data for symmetry analysis as well as control of the laser absolute wavelength and its bandwidth. The laser wavelength is selected using a prior art technique of pivoting mirror 74 until the laser peak wavelength is at the desired value as measured by spectrometer 84 which may be configured as described in U.S. Pat. Nos. 5,025,445 and 5,420,877 to measure both absolute wavelength and spectral shape. The symmetry analysis of the spectrum and the etalon tuning is done in a manner similar to the first embodiment.

Symmetry Analysis

Figure 10:
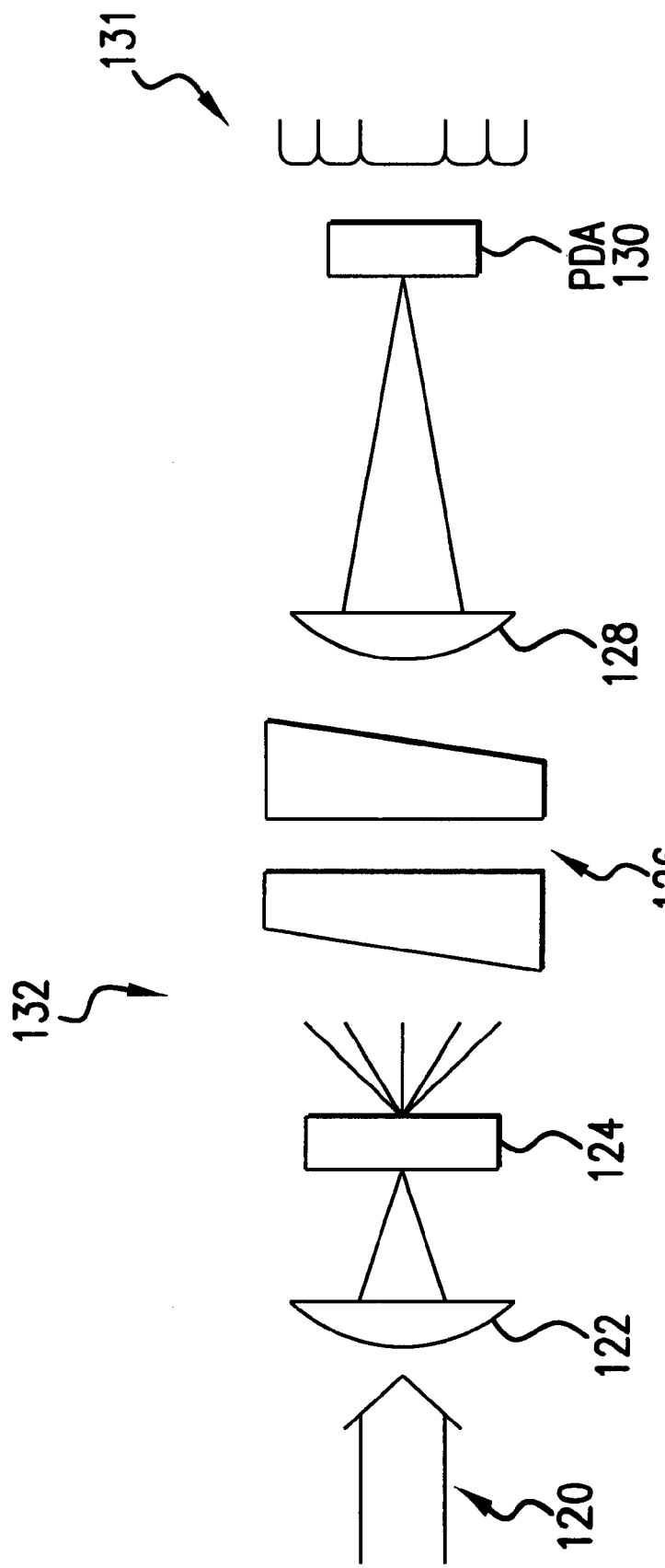
FIG. 10 shows the high resolution etalon spectrometer.

A spectrometer 132 for analyzing symmetry of laser spectrum is shown in FIG. 10. Beam 120 is sampled from beam 102 generated by the laser using beam splitter 98 as shown in FIG. 8. This beam 120, as shown in FIG. 10, is focused onto diffusor 124 using a lens 122. The spectrum is analyzed with a high finesse etalon 126. This preferred embodiment of the present invention uses an etalon with a finesse of about 35 and free-spectral range FSR=5 pm. Such an etalon is available from a number of companies, for example, Lumonics, Inc., Nepean, Canada. The light transmitted through the etalon is then focused on a photo diode array 130 using lens 128. The PDA 130 registers the fringe pattern and transfer the information to controller 86 (FIGS. 4 and 9). A preferred procedure for analyzing the symmetry in the preferred embodiment is as shown below:

Step 1. Acquire N frames of data where N is typically between 1 and 10.

Step 2. Add all N frames together to generate array D.

Step 3. Determine video floor value in dark region of data D_dark .

Step 4. Find fringe peak in the standard predetermined range $D_1$ to $D_2$ for both left and right sets of fringes. D_peak left and D_peak right.

Step 5. If either left or right peaks is not found in the range $D_1$–$D_2$ increase the search range D1–D2 to a maximum range $D_1\_max$–$D_2\_max$ and search again.

Step 6. If no fringe found, report error. Go to Step 1 and acquire next N frames.

Step 7. Calculate the position of center pixel D_center as 0.5 (D_peak left+D_peak right).

Step 8. If D_center deviates by more than predetermined value from normal center pixel position, report error. Go to Step 1 and acquire N frames.

Step 9. Do sliding window averaging of array D with M average. M is set between 1 and 10.

Step 10. Using array calculated in Step 9, start from D_peak_right and scan down (towards center pixel) through D[n] until D[n] is less than 0.67×(D[D_peak right]—D_dark). Do linear interpolation and calculate the first crossing point for 0.67 level D_peak right_67%_1.

Step 11. Repeat Step 10 going up (away from center pixel) from D_peak_right and calculate the second crossing point for 0.67 level D_peak_right_67%_2.

Step 12. Repeat Step 10 going up but use level=0.135 (D[D_peak_right]–D_dark). Calculate crossing point of 0.135 level D_peak_right_13.5%_2.

Step 13. Repeat. Step 12 going down and calculate D_peak_right_13.5%_1.

Step 14. Calculate symmetry of the right peak: h right (=((D_peak_right_13.5%_2 –D_peak_right_67%_2)--(D_peak_right_67%_1-D_peak_right_13.5%_1))/2.

Step 15. Repeat Steps 10 through 14 for the left peak D_left and calculate h_left.

Step 16. Calculate average symmetry h=½·(h_left+h_right).

Although this very narrow band laser has been described with reference to a particular embodiment, it is to be appreciated that various adaptations and modifications may be made. For example, the high resolution grating spectrometer can be used to analyze special symmetry and/or absolute wavelength and bandwidth measurements. Also, the symmetry can be analyzed using different techniques, including using different levels and/or using integrated parameters, such as left and right spectral integral, the central maximum can be calculated as a middle point at some level, such as 50% or 90% level, etc. Also, this invention can be used with many lasers in addition to KrF, ArF, and other excimer lasers, as well as with $F_2$ molecular gas laser. The techniques described for use on a KrF laser which operates at a nominal wavelength can also be applied to ArF lasers; however, the optics must be designed for 193 nm. In addition, to pressure-tuned etalons and piezoelectric-tuned etalons, there are commercially available etalons which are compression-tuned using mechanical force to widen or narrow the gap between the plates of the etalon. Etalons with reflectances other than 4% could be used. In some applications, it may not be necessary to tune the etalon and an etalon with a fixed spacing and fixed index of refraction could be used. In this case, the grating would be tuned with mirror 76 to match one of the etalon reflection peaks. Preferably, however, the reflectance of the reflecting surfaces should be between about 1 and about 20%. Persons skilled in the art will recognize that the grating based line narrowing module described above could be replaced with many other prior art line narrowing modules, such as modules comprised of a plurality of prisms and a totally reflecting mirror, a diffraction grating without beam expanders, and a diffraction grating and a totally reflecting mirror. Transmissive etalons could also be included in the line narrowing module. Therefore, the invention is only to be limited by the appended claims.

What is claimed is:

1. A durable etalon output coupler for an ultraviolet laser designed to produce a laser beam within a desired wavelength range, said output coupler comprising:
   an etalon comprised of:
   1) a first prism defining a first inside surface and a beam entrance surface and being comprised of a material transparent to ultraviolet light within said desired wavelength range and defining an index of refraction $n_{m1}$ which is larger than an index of refraction $n_{a1}$ of a medium adjacent to said beam entrance surface, said beam entrance surface forming angle with said first inside surface defining a first apex angle such that $$\sin\alpha_{a1} = \frac{1}{\sqrt{1+(n_{m1})^2/(n_{a1})^2}}$$

2) a second prism defining a second inside surface and a beam exit surface and being comprised of a material transparent to ultraviolet light within said desired wavelength range and defining an index of refraction $n_{m2}$ which is larger than an index of refraction $n_{a2}$ of a medium adjacent to said beam exit surface, said beam exit surface, said beam exit surface forming an angle with said second inside surface defining a second apex angle $_{a2}$, such that $$\sin\alpha_{a2} = \frac{1}{\sqrt{1+(n_{m2})^2/(n_{a2})^2}}$$

said first and said second prisms being arranged with said first inside surface facing and parallel to said second inside surface and both prisms being arranged with respect to said laser beam such that said laser beam enters said etalon through said entrance surface at or approximately at Brewster's angle and exits said etalon through said exit surface at or approximately at Brewster's angle.

2. A durable etalon output coupler as in claim 1 wherein said desired wavelength range is a range of about 193 nm corresponding to output wavelengths of ArF excimer laser.

3. A durable etalon output coupler as in claim 2 wherein both said first prism and said second prism are comprised of $CaF_2$.

4. A durable etalon output coupler as in claim 3 and further comprising an etalon chamber having two windows said chamber containing a gaseous medium.

5. A durable etalon output coupler as in claim 4 wherein said gaseous medium is nitrogen and said first and second Brewster's angles are approximately 57 degrees and said first and second apex angles are approximately 34 degrees.

6. A durable etalon output coupler as in claim 4 and further comprising a pressure control mechanism for controlling pressure of said gaseous medium in order to tune said durable etalon output coupler.

7. A durable etalon output coupler as in claim 2 wherein said desired wavelength range is in a range corresponding to output wavelengths of $F_2$ lasers.

8. A durable etalon output coupler as in claim 2 wherein said desired output range is chosen from a set of ranges consisting of a range of about 157.63 nm and a range of about 157.32 nm.

9. A laser as in claim 2 and further comprising a beam profile comparison means for comparing profiles of light reflected by said etalon and profiles of light transmitted by said etalon.

10. A laser as in claim 2 and further comprising a beam profile comparison means for comparing profiles of light reflected by said etalon to profiles of light incident on said etalon.

11. A durable etalon output coupler as in claim 1 and further comprising a tuning means for tuning the durable etalon output coupler.

12. A narrow band ultraviolet laser designed to produce a laser beam within a desired wavelength range said laser comprising:
   A. a laser chamber containing a gain medium,
   B. a line narrowing unit positioned to accept a portion of the light generated in the laser chamber, narrow its spectrum to produce line narrowed light, and return it to the laser chamber,
   C. a durable etalon output coupler for an ultraviolet laser designed to produce a laser beam within a desired wavelength range, said output coupler comprising: an etalon comprised of:
      1) a first prism defining a first inside surface and a beam entrance surface and being comprised of a material transparent to ultraviolet light within said desired wavelength range and defining an index of refraction $n_{m1}$ which is larger than an index of refraction $n_{a1}$ of a medium adjacent to said beam entrance surface, said beam entrance surface forming angle with said first inside surface defining a first apex angle such that $$\sin \alpha_{a1} = \frac{1}{\sqrt{1 + (n_{m1})^2/(n_{a1})^2}}$$

2) a second prism defining a second inside surface and a beam exit surface and being comprised of a material transparent to ultraviolet light within said desired wavelength range and defining an index of refraction $n_{m2}$ which is larger than an index of refraction $n_{a2}$ of a medium adjacent to said beam exit surface, said beam exit surface, said beam exit surface forming an angle with said second inside surface defining a second apex angle $_{a1}$, such that $$\sin \alpha_{a2} = \frac{1}{\sqrt{1 + (n_{m2})^2/(n_{a2})^2}}$$

said first and said second prisms being arranged with said first inside surface facing and parallel to said second inside surface and both prisms being arranged with respect to said laser beam such that said laser beam enters said etalon through said entrance surface at or approximately at Brewster's angle and exits said etalon through said exit surface at or approximately at Brewster's angle.

13. A laser as in claim 12 wherein said line narrowing unit is comprised of:
   A. at least one beam expanding prism;
   B. a grating; and
   C. a grating tuning means for tuning the grating.

14. A laser as in claim 13 and further comprising a wavemeter and a wavelength controller for controlling the grating tuning means.

15. A laser as in claim 14 and further comprising an etalon tuning means.

16. A laser as in claim 13 wherein both the grating and the etalon are arranged to provide maximum reflection at a single desired wavelength.

17. An excimer laser as in claim 16 wherein said reflectances are about 4 percent.

18. A laser as in claim 13 wherein both the grating and the etalon are arranged to provide maximum reflection at a single very narrow range of desired wavelength.

19. An excimer laser as in claim 13 wherein said etalon defines two internal parallel surfaces, both of which are free of any coating.

20. A laser as in claim 12 wherein said gain medium is laser gas comprised of fluorine, a buffer gas and argon, and said laser chamber is comprised of materials which are fluorine compatible.

21. A laser as in claim 12 wherein said output coupler is tunable and further comprising an etalon tuning means.

22. A laser as in claim 12 wherein said first inside surface and said second inside surface each has reflectance of less than about 20 percent and greater than about 2 percent.

23. A laser as in claim 22 wherein said reflectance are about 4 percent.

24. A laser as in claim 12 wherein said laser is an excimer laser.

25. An excimer laser as in claim 24 wherein said line narrowing unit comprises at least one prism, a grating and a totally reflecting mirror.

26. An excimer laser as in claim 24 wherein said etalon is a pressure-tuned etalon.

27. An excimer laser as in claim 24 wherein said etalon is piezoelectric-tuned etalon.

28. An excimer laser as in claim 24 wherein said etalon is a compression-tuned etalon.

29. An excimer laser as in claim 24 wherein said etalon has two internal parallel surfaces defining two reflecting surfaces each having reflectances of less than 20 percent and greater than about 2 percent.

30. A method of tuning a very narrow band excimer laser having a gain medium, tunable grating based line narrowing module and a tunable etalon based output coupler comprising an etalon having a Brewster's angle entrance surface and a Brewster's angle exit surface, wherein a portion of light from said gain medium incident on said output coupler is reflected by said output coupler back into the gain medium, and a portion of light from said gain medium is transmitted by said output coupler; said method comprising the steps of:
   A. measuring spectral characteristics of a beam produced by said laser,
   B. tuning said tunable grating based line narrowing module and said tunable output coupler to produce desired beam spectral characteristics.

31. A method as in claim 30 wherein said beam is a beam transmitted by said output coupler.

32. A method as in claim 30 wherein steps of measuring is performed with an etalon based spectrometer.

33. A method as in claim 32 wherein said desired spectral characteristics is a beam spectrum having a single peak with minimum distortion due to mismatch of said tunable grating based line narrowing module and said tunable etalon based output coupler.

34. A method as in claim 30 wherein said beam is a beam reflected by said tunable etalon based output coupler.

35. A method as in claim 34 wherein said desired spectral characteristics is a beam spectrum having a single peak with minimum distortion due to mismatch of said tunable grating based line narrowing module and said tunable etalon based output coupler.

36. A method as in claim 30 wherein said laser comprises an automatic wavelength control wherein said tuning step comprises the substeps of:
  A) tuning said tunable grating based line narrowing module to provide maximum reflection at a desired wavelength,
  B) providing feedback control for said tunable etalon based output coupler to automatically adjust said output coupler to provide maximum reflection at the maximum reflection of said tunable grating based line narrowing module,
  C) automatically tuning said tunable etalon based output coupler to provide maximum reflection at said desired wavelength utilizing said feedback control.

37. A method as in claim 36 wherein said desired wavelength is selected by an operator.

* * * * *